(12) United States Patent
Kizziar

(10) Patent No.: US 6,563,390 B1
(45) Date of Patent: May 13, 2003

(54) DIGITALLY COMPENSATED VOLTAGE CONTROLLED OSCILLATOR

(75) Inventor: John W. Kizziar, Spokane, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/753,063

(22) Filed: Dec. 29, 2000

(51) Int. Cl.$^7$ ................................................ H03B 5/32

(52) U.S. Cl. ................ 331/116 R; 331/158; 331/177 R; 331/179; 331/36 C

(58) Field of Search ............................ 331/36 C, 177 R, 331/57, 179, 158, 116 R, 66, 176, 175

(56) References Cited

U.S. PATENT DOCUMENTS

| 6,104,257 | A | | 8/2000 | Mann | 331/158 |
|---|---|---|---|---|---|
| 6,167,245 | A | * | 12/2000 | Welland et al. | 455/260 |
| 6,181,218 | B1 | * | 1/2001 | Clark et al. | 331/177 R |
| 6,285,264 | B1 | | 9/2001 | Mann | 331/158 |
| 6,308,055 | B1 | * | 10/2001 | Welland et al. | 455/260 |

* cited by examiner

*Primary Examiner*—Arnold Kinkead
(74) *Attorney, Agent, or Firm*—Christopher P. Maiorana, P.C.

(57) ABSTRACT

An apparatus comprising a digitally controlled oscillator and a frequency tuning array. The digitally controlled oscillator may be configured to finely tune an output signal having a frequency in response to a digital signal. The frequency tuning array may be configured to generate the digital signal.

22 Claims, 5 Drawing Sheets

DIGITALLY COMPENSATED VOLTAGE CONTROLLED OSCILLATOR

FIELD OF THE INVENTION

The present invention relates to a method and/or architecture for implementing an oscillator generally and, more particularly, to a method and/or architecture for implementing a digitally compensated voltage controlled oscillator.

BACKGROUND OF THE INVENTION

Conventional approaches for implementing voltage controlled oscillators include tuning capacitors implemented as (i) varactor diodes and (ii) various forms of voltage controlled capacitance circuits. VCOs implementing such approaches are difficult to build with a typical CMOS fabrication process and have poor linear transfer characteristics.

Conventional approaches for implementing digital controlled oscillators include (i) EPROM table capacitance equivalence for a crystal oscillator/PLL circuit and (ii) digitally controlled capacitance without fine tuning capabilities. None of these conventional approaches compensates for non-linear capacitance effects.

SUMMARY OF THE INVENTION

The present invention concerns an apparatus comprising a digitally controlled oscillator and a frequency tuning array. The digitally controlled oscillator may be configured to finely tune an output signal having a frequency in response to a digital signal. The frequency tuning array may be configured to generate the digital signal.

The objects, features and advantages of the present invention include providing a method and/or architecture for implementing a digitally compensated voltage controlled oscillator that may (i) receive a user voltage level, (ii) implement a voltage controlled oscillator (VCO) using a frequency tuning array to fine tune a particular frequency, (iii) provide automatic fine tuning, (iv) implement a capacitance controlled crystal oscillator to operate as a fine tuned digitally controlled oscillator, (v) provide a number of tuning operation modes, (vi) allow each of the operation modes to operate independently, (vii) determined a particular mode in response to a capacitance, and/or (viii) set an oscillator capacitance in response to the mode of operation by (a) an analog voltage signal, (b) a digital signal comprising a first digital word from a control register, and (c) a digital signal comprising a second digital word to a frequency tuning array.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
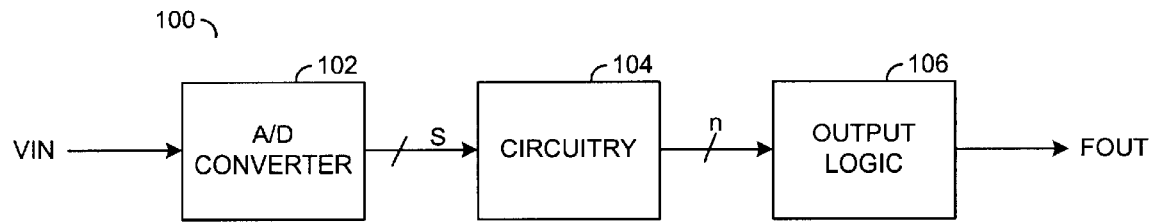
FIG. 1 is a block diagram of a preferred embodiment of the present invention.

Referring to FIG. 1, a block diagram of a circuit (or system) 100 is shown in accordance with a preferred embodiment of the present invention. The circuit 100 generally comprises a circuit 102, a circuit 104 and a circuit 106. The circuit 102 may be implemented as an analog-to-digital (A/D) converter circuit. The circuit 104 may be implemented as tuning circuitry. The circuit 106 may be implemented as an output logic circuit. The A/D converter circuit 102 may receive an input voltage (e.g., VIN) The A/D converter 102 may present a signal (e.g., S) to the tuning circuit 104. The signal S may be implemented as a multi-bit signal. The tuning circuit 104 may present a number of signals n to the output logic circuit 106, where n is an integer. The output logic circuit 106 may generate an output frequency signal (e.g., FOUT). The output logic circuit 106 may generate the frequency FOUT in response to the signals generated by the tuning circuitry 104. The output logic circuit 106 may be digitally controlled by the tuning circuitry 104.

Figure 2:
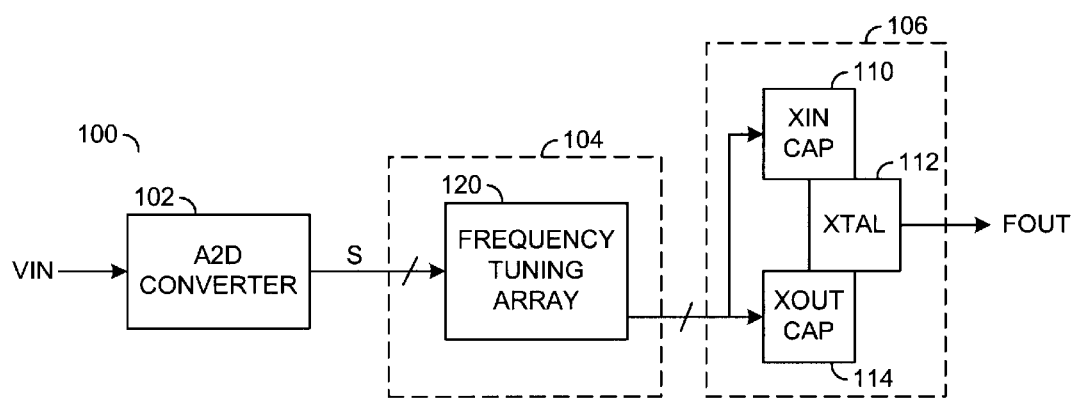
FIG. 2 is a detailed block diagram of the present invention.

Referring to FIG. 2, a more detailed diagram of the circuit 100 is shown. The output logic 106 generally comprises a circuit 110, a circuit 112 and a circuit 114. The circuit 110 may be implemented as a capacitor circuit. The circuit 112 may be implemented as a crystal oscillator circuit. The circuit 114 may be implemented a capacitor circuit. The circuits 110, 112 and 114 may be coupled in a series configuration. However, a particular configuration of the circuits 110, 112 and 114 may be varied. In one example, the circuit 110 may be implemented as an input capacitance circuit and the circuit 114 may be implemented as an output capacitance circuit. In another example, the capacitance circuits 110 and 114 may be implemented as digitally switched capacitors.

The capacitance circuits 110 and 114 may be implemented to provide a particular load capacitance to the crystal oscillator 112. The crystal oscillator 112 may also generate the signal FOUT. The crystal oscillator 112 may generate the signal FOUT in response to the capacitances of the input and output capacitance circuits 110 and 114.

The circuit 104 generally comprises a frequency tuning array (FTA) circuit 120. The FTA 120 may be implemented as a memory. In one example, the FTA 120 may be implemented as a silicon oxide nitride oxide silicon (SONOS) memory or any other static, dynamic, or non-volatile memory. The A/D converter 102 may present the signal S to the FTA 120. The FTA 120 may generate a signal that may be presented to the input capacitance circuit 110 and the output capacitance circuit 114. The FTA 120 may control the output logic circuit 106. Thus, the FTA 120 may control the frequency of the signal FOUT. The FTA 120 may control fine tuning of the signal FOUT.

Figure 3:
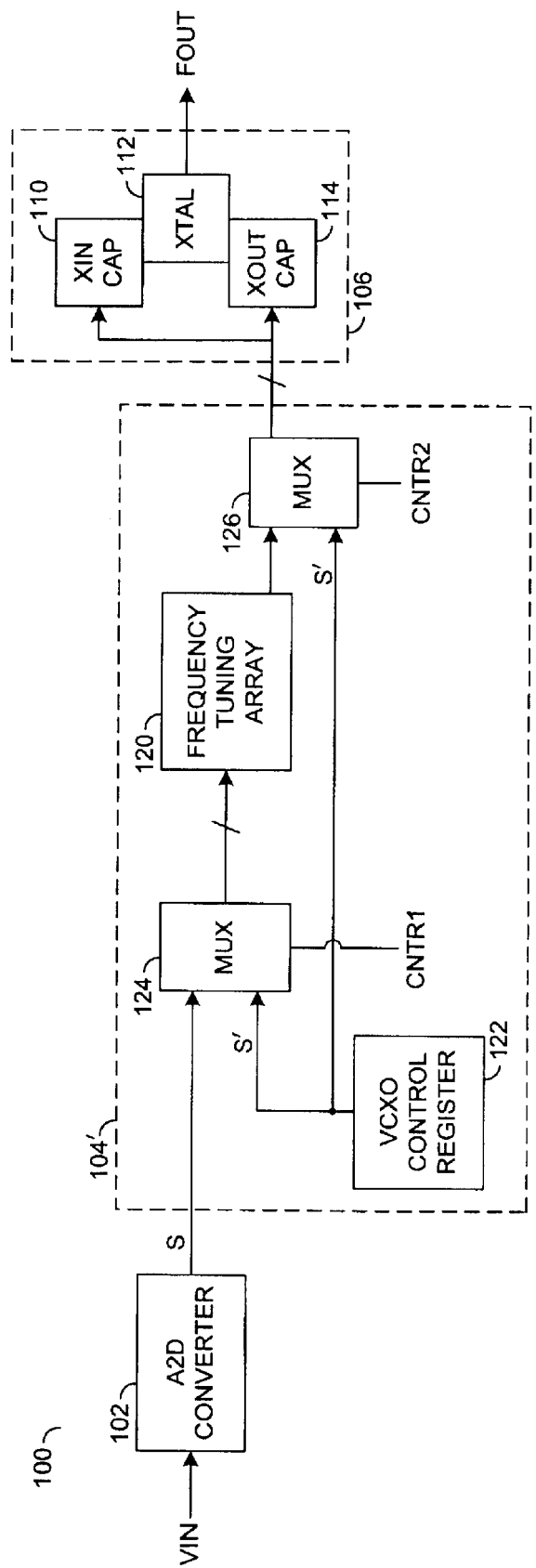
FIG. 3 is a block diagram of an alternate embodiment of the present invention.

Referring to FIG. 3, an alternate embodiment of the circuit 100 is shown. The tuning circuitry 104' may be similar to the tuning circuitry 104. The tuning circuitry 104' may comprise the frequency tuning array 120. Additionally, the tuning circuitry 104' may comprise a circuit 122, a circuit 124 and a circuit 126. The circuit 122 may be implemented as a control register. The circuit 122 may be implemented as a VCXO control register. The circuit 124 and the circuit 126 may each be implemented as multiplexer circuits.

The A/D converter 102 may present the signal S to the multiplexer 124. The control register 122 may present a signal (e.g., S') to the multiplexer 124 and the multiplexer 126. The multiplexer 124 may select either the signal S from the circuit 102 or the signal S' from the control register 122, in response to a select signal (e.g., CNTR1). The multiplexer 124 may then present a signal to the FTA 120. The FTA 120 may present a signal to the multiplexer 126. The multiplexer 126 may select either the signal S' from the control register 122 or the output of the FTA 120, in response to a select signal (e.g., CNTR2). The multiplexer 126 may present a signal to the output capacitance circuit 114.

The circuit 100 may provide a voltage controlled oscillator where a capacitance (via the capacitance circuit 110 and 114) applied to the crystal oscillator 112 may set the operating frequency of the signal FOUT. The circuit 100 may vary a capacitance of the input capacitance circuit 110 and/or the output capacitance circuit 114 to tune the frequency of the output FOUT. The A/D converter 102 and the frequency tuning array 120 may allow the analog voltage VIN to directly control the capacitance circuits 110 and/or 114 in order to provide such frequency tuning. The A/D converter 102 may be implemented to receive analog voltage inputs. The VCXO control register 122 may be implemented for direct digital control. The desired input of the circuit 100 is generally selected by the multiplexer 124.

The present invention may have three modes of operation (i) an analog voltage input control mode (e.g., controlled through the signal VIN), (ii) a VCXO disabled mode (e.g., where coarse frequency tuning from a fixed capacitance is set directly by the VCXO control register 122), and (iii) a digital VCXO mode (e.g., where the fine frequency tuning is set by the VCXO through the frequency tuning array 104). Each of the modes of operation may be independently implemented. However, when implemented together, a particular mode may be determined by the signals CNTR1 and CNTR2 presented to the multiplexers 124 and 126.

When operating in the VCXO enabled mode, fine tuning of the frequency FOUT may be digitally controlled. Information programmed in the VCXO control register 122 may determine a capacitance value for the input capacitance circuit 110. The operating frequency FOUT may then be adjusted accordingly. The capacitances 110 and 114 may be determined (e.g., from the frequency tuning array 120).

The control signal S' may be implemented as an 8-bit signal. The circuit 100 may have 10 sizes of capacitances within a range enabling programming characteristics such as nominal capacitance, pulling range, adjustment for non-linear pulling, etc. However, a particular number of capacitances and/or programming characteristics (or features) may be varied to meet the design criteria of a particular implementation. The output logic circuit 106 (e.g., the oscillator 112, the input capacitance circuit 110 and the output capacitance circuit 114) may be implemented as a digital voltage controlled oscillator. The output frequency FOUT may be digitally controlled through the A/D converter 102 or through the control register 122. The signal FOUT may be tuned by changing the capacitances of the input and output capacitor circuits.

When fine tuning is disabled, a fixed load capacitance value is set directly by the VCXO control register 122 through the path provided by the multiplexer 126. Frequency tuning can be achieved in this mode by programming the register 122. However, the resolution is generally not as fine as when the VCXO 112 is enabled.

In one example, the present invention may provide 10 total bits of capacitor control. The most significant bit (MSB) capacitors (e.g., larger capacitors) may be implemented with substantially identical unit capacitors to improve linearity. The capacitors are generally implemented in a thermometer-decoding scheme to avoid large voltage glitches on the input capacitance 110 or the output capacitance 114, as the capacitors switch. The least significant bit (LSB) capacitors (e.g., smaller capacitors) use binary weighting for efficiency. Proposed capacitance values of the circuit 100, are shown in the following TABLE 1:

TABLE 1

| Size | Total Cap | Unit Caps | Cap Value | Tuning Array | Binary Caps |
|---|---|---|---|---|---|
| 8 | 20.000 | 16 | 1.250 | FTA<9> | |
| 7 | 10.000 | 8 | 1.250 | FTA<8> | |
| 6 | 5.000 | 4 | 1.250 | FTA<7> | |
| 5 | 2.500 | 2 | 1.250 | FTA<6> | |
| 4 | 1.250 | 1 | 1.250 | FTA<5> | Spare |
| 3 | 0.625 | 1 | 0.625 | | FTA<4> |
| 2 | 0.313 | 1 | 0.313 | | FTA<3> |
| 1 | 0.156 | 1 | 0.156 | | FTA<2> |
| 0 | 0.078 | 1 | 0.078 | | FTA<1> |
| −1 | 0.039 | 1 | 0.039 | | FTA<0> |
| −2 | 0.020 | 1 | 0.020 | | Spare |

The "Tuning Array" and "Binary Caps" columns of TABLE 1 generally connect to capacitors on both the input capacitance circuit 110 and the output capacitance circuit 114.

Figure 4:
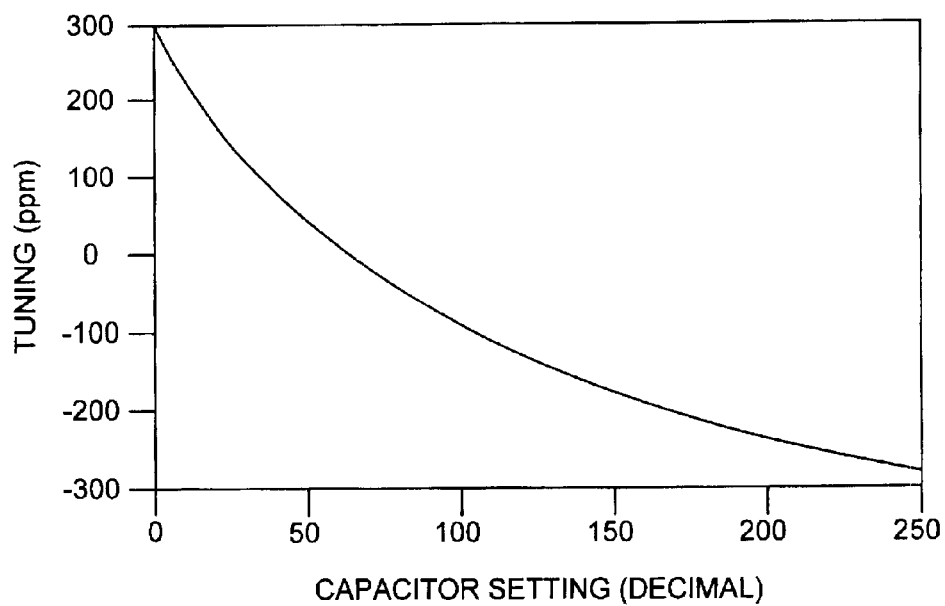
FIG. 4 is a diagram illustrating an operation of the present invention.

Referring to FIG. 4, an exemplary operation diagram is shown illustrating a tuning curve of the present invention. A total range of tuning capability was found by setting all possible capacitance values through the register 122. In one example, a range of the VCXO control register 122 may be ±300 PPM (parts per million). The frequency tuning array 120 needed to provide linear, monotonic frequency tuning from the VCXO control register 122. Thus, capacitor values may be implemented for the FTA 120 to provide a linear curve for the desired PPM range.

Figure 5:
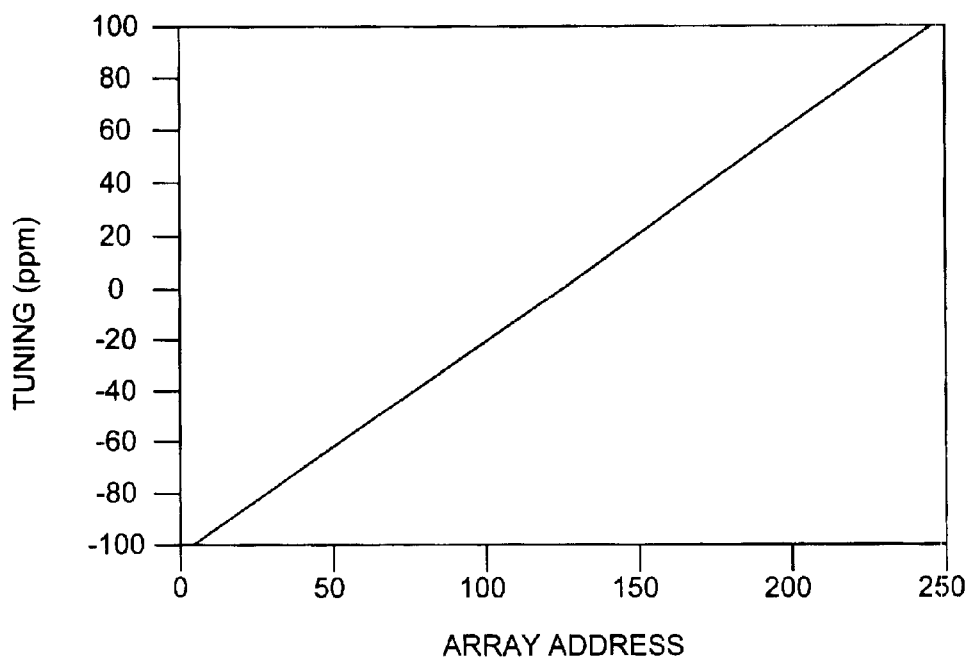
FIG. 5 is a diagram illustrating an operation of the present invention.
Figure 6:
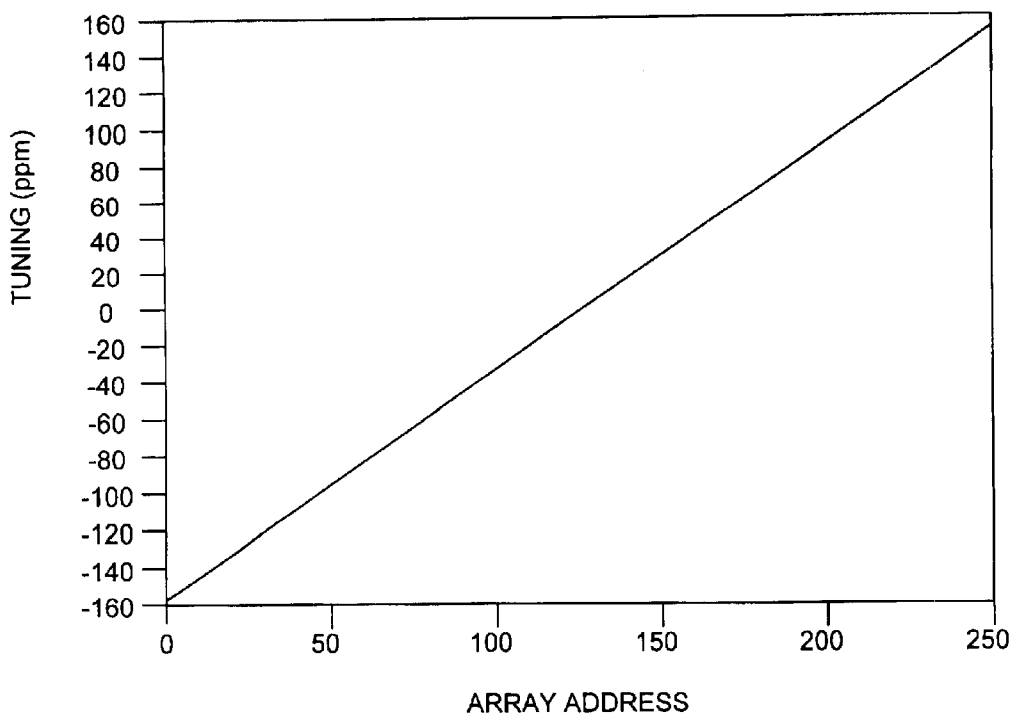
FIG. 6 is a diagram illustrating an operation of the present invention.
Figure 7:
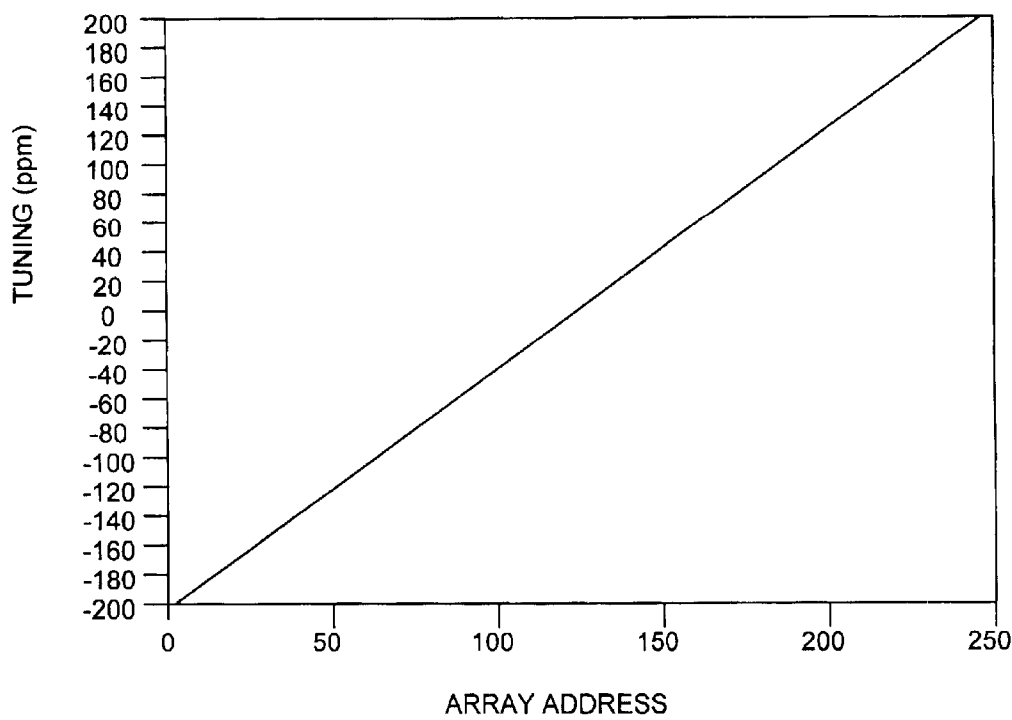
FIG. 7 is a diagram illustrating an operation of the present invention.

Referring to FIGS. 5–9, operational diagrams of the present invention are shown. The operational diagrams of FIGS. 5, 6 and 7 may illustrate tuning curves generated for varying PPM ranges. FIG. 5 may illustrate a tuning curve for a PPM range of ±100. FIG. 6 may illustrate a tuning curve for a PPM range of ±150. FIG. 7 may illustrate a tuning curve for a PPM range of ±200.

Figure 8:
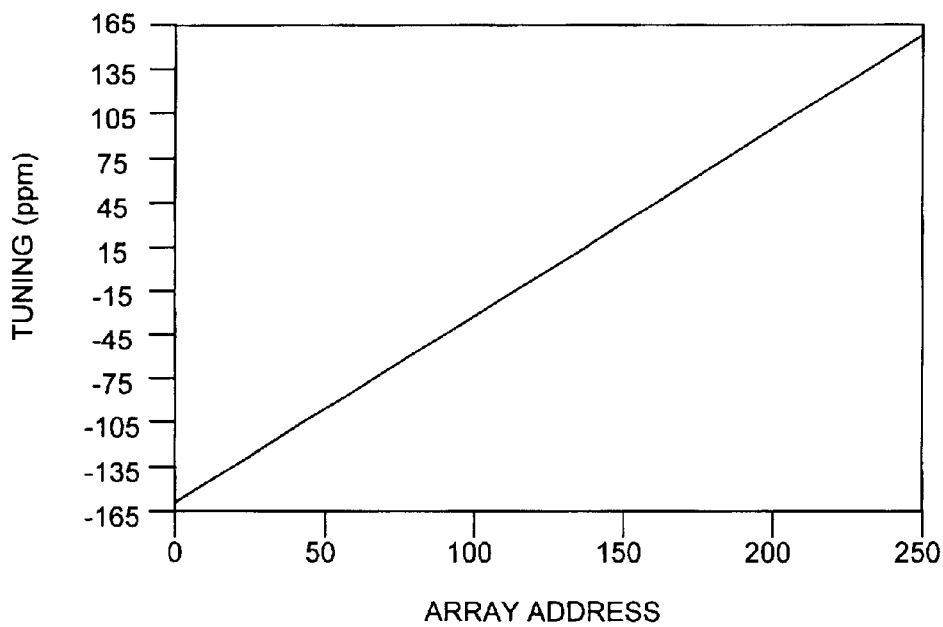
FIG. 8 is a diagram illustrating an operation of the present invention.
Figure 9:
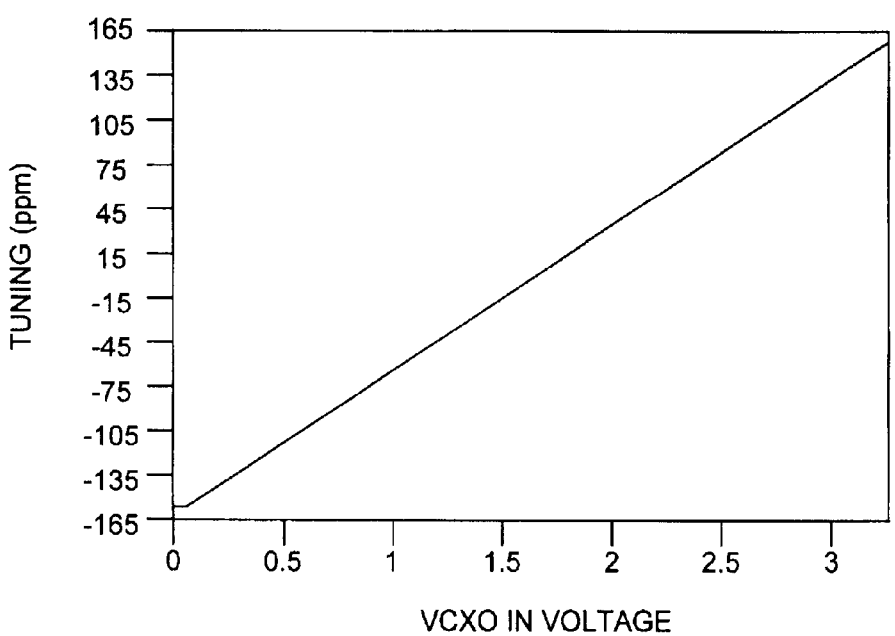
FIG. 9 is a diagram illustrating an operation of the present invention.

Referring to FIGS. 8 and 9, an example of the circuit 100 that may allow for a PPM range of ±150 is shown. However, the circuit 100 may provide a PPM range of ±160 to allow for variations such as temperature and voltage. In FIG. 8, a tuning curve generated by addressing the FTA 120 is shown. In FIG. 9, a tuning curve generated by enabling A/D conversion and sweeping a VCXO input voltage from 0.0V to 3.3V in 13 mV steps (the resolution of A/D converter) is shown. The tuning curve of FIG. 9, may result in 1.3 PPM per 13 mV step with a range of −161 PPM to +161 PPM. The curve generated by the VCXO input through the A/D converter (FIG. 9) is slightly different than the digital curves of FIGS. 6–9. Specifically, small voltages (e.g., the first three steps) do not change.

The circuit 100 may provide a digitally compensated voltage controlled oscillator circuit. The VCO 100 comprising a capacitance controlled crystal oscillator (e.g., the oscillator 112) configured to operate as a fine tuned digitally controlled oscillator in response to a digital signal presented by a frequency tuning array (e.g., the FTA 120). The circuit 100 may also provide a coarse tuned digitally controlled oscillator in response to a digital signal S' presented by a control register (e.g., register 122). Additionally, the circuit 100 may allow each of the oscillator configurations (or modes) to operate exclusively (e.g., independently) of each another.

The circuit 100 may receive a user voltage level (e.g., the signal VIN). The circuit 100 may provide an analog voltage controlled oscillator in response to the input analog voltage VIN. The circuit 100 may also automatically fine tune a VCO in response to the user voltage level VIN.

The circuit 100 may further provide a number of operation modes. A particular mode of operation may be determined in response to a particular capacitance. The oscillator capacitance may be set in response to the mode of operation by (i) an analog voltage signal, (ii) a first digital signal comprising a first digital word from a control register, and (iii) a second digital signal comprising a second digital word to a frequency tuning array.

The various signal of the present invention may be implemented as single-bit or multi-bit signals in a serial and/or parallel configuration. The various signals of the present invention are generally "on" (e.g., a digital HIGH, or 1) or "off" (e.g., a digital LOW, or 0) However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a digitally controlled oscillator configured to finely tune an output signal having a frequency in response to (i) a first digital signal and (ii) an analog input voltage signal; and
    a frequency tuning array configured to generate said first digital signal, wherein said frequency tuning array comprises a decoder configured to provide linear tuning over a predetermined range by setting a capacitance in response to (i) said analog input voltage signal, (ii) a second digital signal comprising a first digital word from a control register, and (iii) a third digital signal comprising a second digital word.

2. The apparatus according to claim 1, wherein said digitally controlled oscillator further comprises:
    a coarse tuning circuit configured to provide coarse tuning of said output signal.

3. The apparatus according to claim 2, wherein said coarse tuning circuit is configured in response to a coarse tuning signal.

4. The apparatus according to claim 3, wherein said coarse tuning signal is presented by said control register.

5. The apparatus according to claim 1, wherein said digitally controlled oscillator comprises:
    a first capacitance circuit;
    a second capacitance circuit; and a
    a crystal oscillator configured to operate as a fine tuned digitally controlled oscillator and coupled to said first and second capacitance circuits.

6. The apparatus according to claim 5, wherein said first capacitance circuit, said second capacitance circuit and said crystal oscillator are coupled in a series configuration.

7. The apparatus according to claim 5, wherein said first capacitance circuit is configured in response to a first portion of said first digital signal.

8. The apparatus according to claim 7, wherein said second capacitance circuit is configured in response to a second portion of said first digital signal.

9. The apparatus according to claim 8, wherein said digitally controlled oscillator is configured in response to said second digital signal.

10. The apparatus according to claim 1, wherein said digitally controlled oscillator comprises:
    a fine tuning circuit configured to provide fine tuning of said output signal; and
    a coarse tuning circuit configured to provide coarse tuning of said output signal, wherein said fine tuning circuit and said coarse tuning circuit are configured to exclusively operate.

11. The apparatus according to claim 1, wherein said apparatus is configured to operate as an analog voltage controlled oscillator configured in response to said analog input voltage signal.

12. The apparatus according to claim 1, wherein said apparatus operates in a mode configured as (i) an analog voltage controller oscillator, (ii) a coarse tuned digitally controlled oscillator and (iii) a fine tuned digital controlled oscillator, wherein each of said modes operates independently of the other modes.

13. An apparatus comprising:
    means for controlling an oscillator circuit to provide an output signal having a frequency; and
    means for finely tuning said oscillator in response to a first digital signal and an analog input voltage, wherein said fine tuning means comprises a decoder configured to provide linear tuning over a predetermined range in response to (i) an analog voltage signal, (ii) a second digital signal comprising a first digital word from a control register, and (iii) a third digital signal comprising a second digital word.

14. A method for controlling an oscillator circuit to generate an output signal having a frequency, comprising the steps of:
    (A) receiving an analog user voltage level and a first digital signal;
    (B) automatically fine tuning said oscillator circuit in response to said analog user voltage level and said first digital signal, wherein said fine tuning comprises providing linear tuning over a predetermined range in response to a decoder; and
    (C) setting an oscillator capacitance in response to (i) an analog voltage signal, (ii) a second digital signal comprising a first digital word from a control register, and (iii) a third digital signal comprising a second digital word.

15. The method according to claim 14, wherein step (B) further comprises the sub-step of:
    (B-1) adjusting a first capacitance;
    (B-2) adjusting a second capacitance; and
    (B-3) finely tuning said output signal in response to said first and second capacitances.

16. The method according to claim 15, wherein sub-steps (B-1) and (B-2) are digitally controlled.

17. The method according to claim 14, wherein step (B) further comprises:

finely tuning said output signal; and coarsely tuning said output signal exclusive of said finely tuning.

18. The method according to claim 14, further comprising the step of:

determining a mode of operation from a plurality of operational modes, wherein each of said plurality of operational modes operates exclusively.

19. An apparatus comprising:

a digitally controlled oscillator configured to finely tune an output signal having a frequency in response to a digital signal; and a frequency tuning array configured to generate said digital signal, wherein said apparatus operates in a mode configured as (i) an analog voltage controlled oscillator, (ii) a coarse tuned digitally controlled oscillator and (iii) a fine tuned digital controlled oscillator and each of said modes operates independently of the other modes.

20. The apparatus according to claim 1, wherein said first digital signal is configured to tune an input capacitance circuit and an output capacitance circuit of said oscillator.

21. The apparatus according to claim 1, wherein said decoder comprises a thermometer decoder configured to avoid switching voltage glitches.

22. An apparatus comprising:

a digitally controlled oscillator configured to finely tune an output signal having a frequency in response to digital signal; and a frequency tuning array configured to generate said digital signal, wherein (a) said apparatus is configured to operate in response to an input analog voltage and (b) said apparatus operates in (i) a first mode configures in response to an analog voltage control signal, (ii) a second mode configured in response to a control register and (iii) a third mode configured in response to a frequency tuning array, wherein each of said modes is selected in response to a multiplexer.

* * * * *